(12) United States Patent
Hunt et al.

(10) Patent No.: US 9,212,424 B1
(45) Date of Patent: Dec. 15, 2015

(54) FLAME-ASSISTED FLASH SINTERING

(71) Applicant: nGimat Co., Norcross, GA (US)

(72) Inventors: Andrew Tye Hunt, Atlanta, GA (US); Stephen Johnson, Georgetown, KY (US); Ganesh Venugopal, Johns Creek, GA (US)

(73) Assignee: nGimat Co., Lexington, KY (US)

( * ) Notice: Subject to any disclaimer, the term of this patent is extended or adjusted under 35 U.S.C. 154(b) by 0 days.

(21) Appl. No.: 14/721,171

(22) Filed: May 26, 2015

Related U.S. Application Data

(63) Continuation of application No. 14/169,470, filed on Jan. 31, 2014, now abandoned.

(60) Provisional application No. 61/759,074, filed on Jan. 31, 2013.

(51) Int. Cl.
*H01L 21/326* (2006.01)
*C23C 24/08* (2006.01)
*H01L 21/02* (2006.01)

(52) U.S. Cl.
CPC .......... *C23C 24/082* (2013.01); *H01L 21/0237* (2013.01)

(58) Field of Classification Search
CPC .. C23C 24/082; C23C 24/085; C23C 24/087; H01L 21/02365; H01L 21/0237
USPC .................................. 438/470, 482, 485, 488
See application file for complete search history.

(56) References Cited

U.S. PATENT DOCUMENTS

| | | | | |
|---|---|---|---|---|
| 5,994,637 A | * | 11/1999 | Imanishi et al. | ......... H01L 35/34 136/201 |
| 8,889,453 B2 | * | 11/2014 | Park | ..................... H01L 35/16 257/E31.054 |
| 2003/0057560 A1 | * | 3/2003 | Tatoh et al. | ............ H01L 35/32 257/773 |
| 2013/0255740 A1 | * | 10/2013 | Delaizir et al. | ......... H01L 35/32 136/205 |

* cited by examiner

*Primary Examiner* — Kevin M Picardat
(74) *Attorney, Agent, or Firm* — William M. Brown

(57) ABSTRACT

The present disclosure is directed to an apparatus and method of sintering inorganic powder coatings on substrates, and includes a flame and an electric plasma. The method is capable of being used in an open atmospheric environment. The substrate is electrically conductive and is used as one electrode while the flame is used as the other electrode that is moved over the areas of the powder coating to be sintered. An electrical current is used to cause a plasma produced through the flame, resulting in a combined energy and temperature profile sufficient for inorganic powder-powder and powder-substrate bonding. This method is referred to as "flame-assisted flash sintering" (FAFS).

20 Claims, 12 Drawing Sheets

Not to Scale

Not to Scale

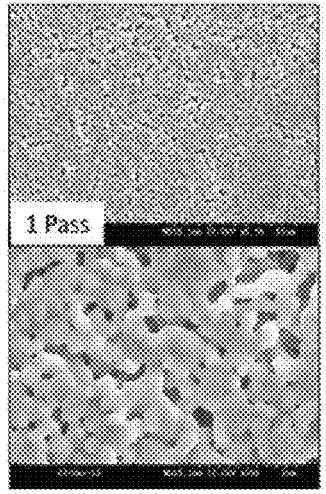
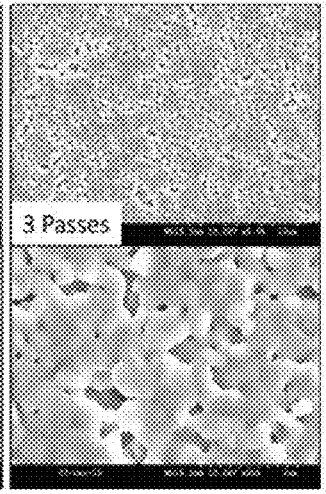
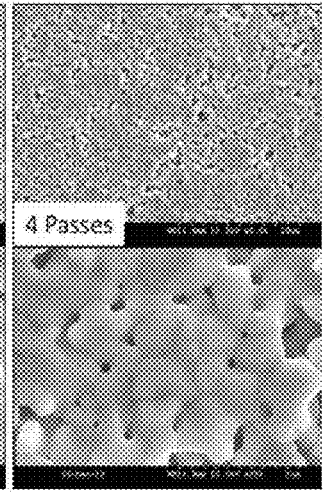
FIG. 6
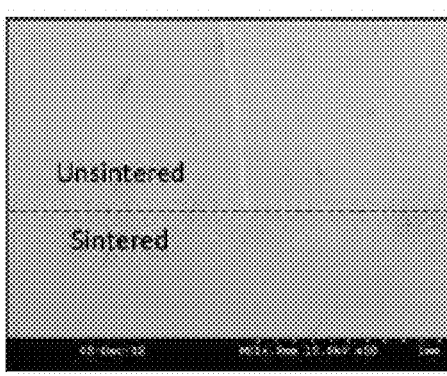
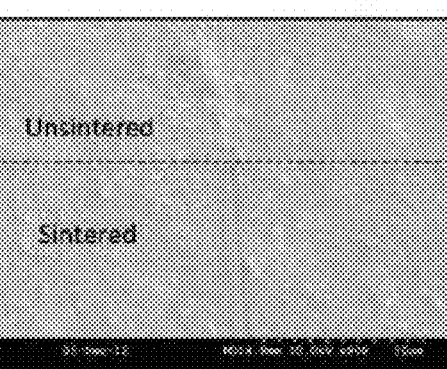
FIG. 7a    FIG. 7b

FLAME-ASSISTED FLASH SINTERING

CROSS REFERENCE TO RELATED CASES

This application is a continuation of U.S. Non-Provisional application Ser. No. 14/169,470, filed on Jan. 31, 2014. The entirety of that application is hereby incorporated.

This application claims the benefit of priority of U.S. Provisional Application Ser. No. 61/759,074, filed on Jan. 31, 2013. The entirety of that provisional application is hereby incorporated.

STATEMENT REGARDING FEDERALLY SPONSORED RESEARCH OR DEVELOPMENT

This invention was made with government support under Contract No. F121-181-0680, awarded by the United States Air Force. The Government has certain rights in this invention.

BACKGROUND

1. Field of the Disclosure

The present disclosure is directed to an apparatus and method of sintering coatings onto substrates, and includes the use of a flame with an electric field plasma. The method is capable of being used in an open atmospheric environment. An electrical voltage is used to generate an electric plasma produced through the flame, resulting in a combined energy profile sufficient for powder-powder sintering and powder-substrate bonding. This method is referred to as "flame-assisted flash sintering" (FAFS).

2. Background of the Disclosure

Ceramic coatings on metallic substrates serve myriad purposes in a number of applications because the ceramics provide desirable wear, hardness, chemical, appearance, wetting, thermal, or electrical properties. One very important area of use is for heat exchangers, in which the ceramic coating typically serves to shield the underlying metal from unwanted effects due to extreme heat or chemical corrosion. A pure metal is desirable for the most efficient exchange of heat, but modern air-conditioning and energy recovery systems can generate temperatures in excess of 500° C. that can lead to decreased performance and longevity, because of corrosion and oxidation of the metal. Because ceramic materials generally have superior temperature and corrosion resistance, compared with metals, ceramics can extend the life of heat exchangers operating in extreme environments, albeit with some reduction in operating efficiency.

Ceramic coatings are also essential to performance and longevity in thermal barrier coatings (TBC) for gas-turbine engines, among other applications. The hot gas streams in gas-turbine engines can reach temperatures well in excess of 1000° C. and a barrier coating is thus necessary to protect the underlying metal from corrosion and, for TBC, thermally insulating coatings are helpful.

Numerous other applications are known to benefit from ceramic coatings onto metals, including fuel cells, battery-electrode coatings, wire-insulation coatings, wear and abrasion surfaces, cookware, engines, exhaust shields, power plants of various types, biomedical implants, and aerospace applications.

Two common methods to deposit ceramics onto metals are air plasma spraying (APS) and electron-beam physical vapor deposition (EB-PVD). In APS, ceramic powder is injected into an acetylene-oxygen flame nozzle that contains a plasma arc formed by a voltage and the high temperatures generated from the combustion process. As the powder feedstock is injected through this hot region (>2500° C.), the powder melts and some consolidates into large droplets that are then conveyed to the metal substrate where they splat-impact, cool, and resolidify. This method is widely used to make thick porous films of ceramics, but is not suitable for making very thin, smooth films with high density and low porosity.

The porosity and smoothness issue is improved when using EB-PVD, where an intense beam of electrons melts and vaporizes a solid ceramic target inside a vacuum chamber. As a melt is formed, vapor-phase material is generated within the low-pressure chamber and a uniform coating is deposited on a nearby substrate. Although this process deposits films that are generally superior to APS, the method is costly, because it is slower and requires expensive vacuum chambers, source targets, and power supplies for beam generation and steering. Moreover, in any vapor-phase deposition, a large percentage of the target material becomes wasted and deposited on the surrounding chamber walls and the substrate must be manipulated in the vacuum chamber to coat all the surfaces. Thus, cost is a limiting issue with EB-PVD and it is only used in the most demanding applications. Plasma-enhanced chemical vapor deposition (PECVD) is a similar technique in that it is a low-pressure vapor deposition process, but suffers from some of the same cost issues as EB-PVD.

Various techniques exist that use electric fields to sinter ceramic materials. Such techniques are collectively referred to as "field-assisted sintering" (FAST), and include spark plasma sintering (SPS), pulsed electric current sintering (PECS), and flash sintering. In all of these methods, an electric field is applied across a green body material and resistive heating caused by current flow consolidates the powder material. Traditional SPS applies uniaxial pressure to a ceramic green body sample that is sandwiched between two conductive graphite dies that generate the electric field. Commercial versions of such systems exist, but they are not well-suited to handle large-area thin films or complex shapes, and typically require a vacuum atmosphere. Published information shows such electric field-induced sintering has been applied to ceramic parts but not to coatings of ceramic on metals or other conductive substrates.

In a variation on SPS, several publications have demonstrated that so-called "flash sintering" can be used to consolidate ceramics at moderately low temperatures without the need for external pressure or a vacuum. Flash sintering uses an external heating source to bring the ambient temperature of the ceramic to a baseline temperature (for example, as low as ~850-1000° C. for YSZ), and an electrical current flowing through the sample then consolidates the powder in a matter of seconds. Reduced sintering temperatures and times present a major opportunity for cost savings in materials processing. The actual temperature at which sintering occurs, and the speed of sintering was shown to be controlled by the electric field strength. In each of the above-mentioned field-assisted processes, the physical restriction of having two conductive electrodes limits the geometries of the ceramic parts being sintered.

Although common applications of ceramic coating may be satisfied by the various ceramic coating processes described, there is a continuing need for a method of ceramic coating that produces very little waste in terms of coating material, that works well for large or contoured parts, and that can be applied under atmospheric conditions, free of the burdens of traditional vacuum chambers.

SUMMARY OF THE INVENTION

The present invention comprises a method and its apparatus for sintering powder coatings onto electrically conductive substrates, including the use of a flame with an electric plasma to sinter a powder, or layer applied to a substrate surface. The method is capable of being used in an open atmospheric environment. The substrate is electrically conductive and is used as one electrode while the flame is used as the other electrode that is moved over the areas of the powder coating to be sintered. An electrical voltage is used to generate an electric plasma within the flame, resulting in a combined temperature and energy profile sufficient for powder-powder sintering and powder-substrate bonding. This method is referred to as "flame-assisted flash sintering" (FAFS).

Powders may include metals, semiconductors, ceramics, and composites. Suitable examples of metals include base metals and alloys, such as those listed in the ASTM database as well as other publications. Highly conductive materials, such as aluminum, copper, silver, or precious metals, will be more difficult to sinter unless the connection between the grains is poor so that the powder layer is more resistive prior to FAFS processing. Examples of semiconductors include those listed in various semiconductor databases and numerous publications, and include pure materials and mixed valence materials. Suitable ceramics include metal oxides or metalloid oxides and most compounds in publications including the PDF file or ceramic phase diagram databases. Composite examples include a combination of any of the above metals, semiconductors, and/or ceramics, such as stainless steel mixed with YSZ or alumina to better match thermal expansion coefficient or improve the bond strength to that of the substrate. Coatings may be composed of powders, binders, and coating-stabilizing additives. The binder may be an organic material, such as a polymer, that is volatilized either before or during the FAFS process. Alternatively, the binder may be an inorganic material, such as alumina, that could be integrated into the ceramic structure during the sintering process. Substrates may include metals, semi-conductors, composites, metal-coated insulators, and ceramics, so long as they conduct electricity better than the powder coating layer at sintering temperatures. Examples of suitable substrates include all the semiconductors and metals above, with common ones including various grades of steel, titanium, aluminum, silver, precious metals, and superalloys.

Coatings may be deposited by a variety of methods, including Meyer Rod drawing, doctor-blade coating, dip-coating, spin-coating, aerosol-jet printing, inkjet printing, and electrophoretic deposition.

Advantages of the present invention include that it enables a lower cost and non-contact method of electric field sintering powder coatings, decreases sintering times, enables applications not suitable for vacuum chambers, is amenable to large and complex shapes, and has the potential to control the degree of sintering and grain growth through judicious selection of process parameters.

BRIEF DESCRIPTION OF THE DRAWINGS

FIG. 1c is a detailed view taken from FIG. 1a, showing features in greater magnification.

FIG. 2 shows a chart describing current as a function of voltage V 140 through a flame 120. The fuel mixture used for FIG. 2 includes propane for Gas 1 130, and oxygen for Gas 2 135. Substrate 160 is stainless steel, coated with a 20-25 micron-thick powder layer 180 of 8YSZ ceramic.

In FIG. 3a, the traverse speed S 245 is "near zero," resulting in the plasma energy spot 310 generally centered within the flame energy spot 300 in concentric circles.

FIG. 3b shows a similar illustration to FIG. 3a for a "slow" traverse speed S 245 (but greater than near zero), wherein the plasma energy spot 310 is shown offset from the flame energy spot 300 in a direction of travel of velocity Tx 235.

FIG. 3c shows a case having a "fast" traverse speed S 245 (greater than "slow"), wherein the plasma temperature rise TRP1 355 is experienced even more quickly due to a further decrease in time dt 370.

FIG. 3e shows an irregular pattern having an area of overlap.

FIG. 4a is an image of actual test results from the experimental parameters and conditions shown in Table 1.

FIG. 4b is a line drawing reproduced from a section of FIG. 4a for clarity. Lines illustrate ceramic particles of 8% yttria-stabilized zirconia ("8YSZ") that were sintered as the plasma within the flame traversed a path over the surface. The flame path is indicated by the vertical arrow shown.

FIG. 4c shows a magnified view of FIG. 4a including the scale of the image.

FIGS. 5a and 5b correspond to the Table 2 parameters.

FIG. 5a illustrates a continuously sintered line roughly three times the width of the sintered features shown in Example 1, but the change in contrast is more subtle, with grain features still evident.

FIG. 5b shows three scanning electron microscope (SEM) images, corresponding to the three power levels.

FIG. 6 shows scanning electron microscope images of sintered features having varying numbers of passes. FIG. 6 shows the parameters of Table 2 but includes multiple FAFS passes.

FIGS. 6a and 6b show a level of consolidation of particles with one pass, although some porosity is visible.

FIGS. 6c and 6d show an increase to three passes with a corresponding increase in particle consolidation due to increased grain growth.

In FIGS. 6e and 6f, yet a further increase in consolidation is shown.

FIGS. 7a-b show scanning electron microscope images contrasting the scratch resistance of unsintered and sintered test results. FIGS. 7a and 7b each show SEMs of two samples stitched together in the same image. The top image shows an unsintered region (no arc plasma), while the bottom image shows a sintered region (with arc plasma).

In FIG. 7a, a scratch is clearly shown in the unsintered region, but is essentially invisible in the sintered region, confirming a bond between the ceramic and the substrate. The scratch pressure was not measured, but was consistent.

FIG. 7b is a magnified view of FIG. 7a. The scratch is clearly seen in the unsintered region and a mark is seen in the sintered region, but ceramic was not removed from the substrate.

In FIG. 8a, the FAFS device was rastered with small offsets in the regions that exhibited a lighter, more reflective surface.

Figure 8A:
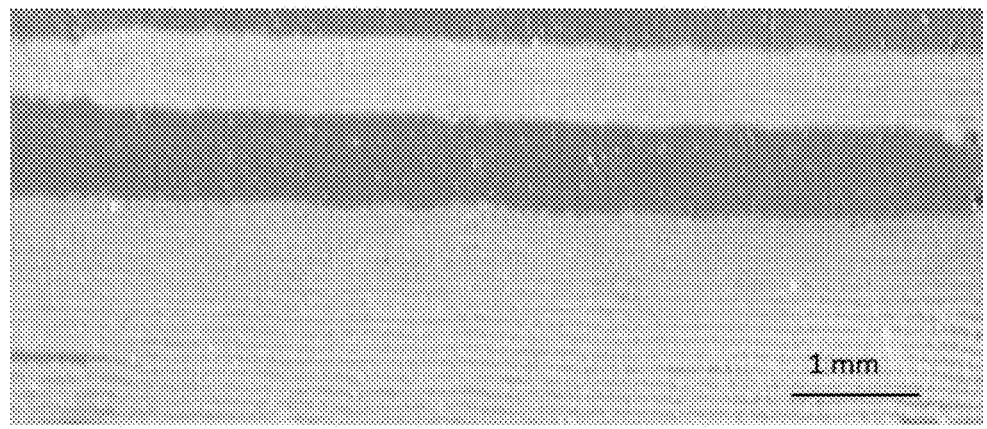
FIGS. 8a-b show a photograph and scanning electron micrograph, respectively, of LSM ceramic particles that were densified using the present invention. The FAFS process was optimized to demonstrate a region of sintered surface LSM that was achieved by running the FAFS equipment in a defined pattern. The plasma arc path on the LSM coatings was mostly continuous and well-defined straight line that moved with the flame path.
Figure 8B:
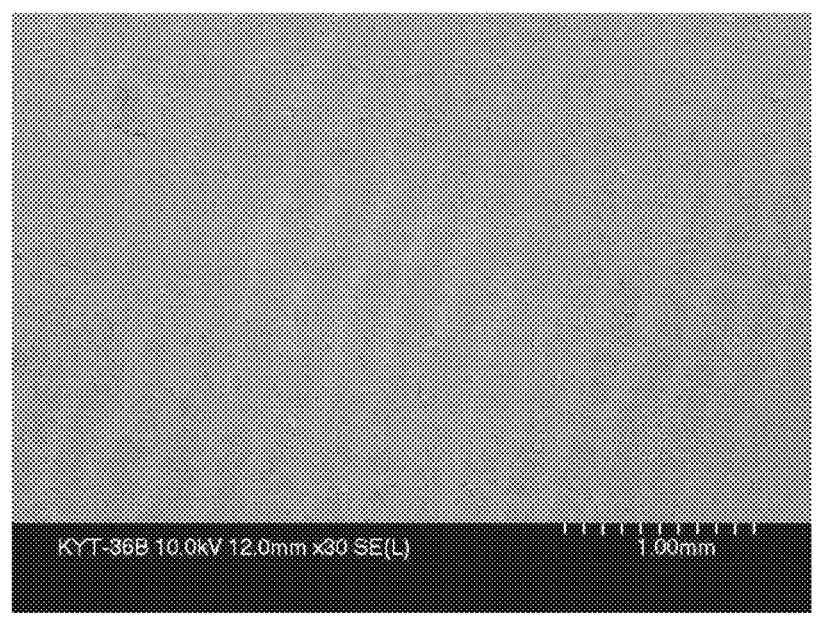

The color change is indicative of material densification, as shown in FIG. 8b, which is a higher magnification scanning electron microscope image of the same surface shown in 8a.

DETAILED DESCRIPTION OF THE INVENTION

Figure 1A:
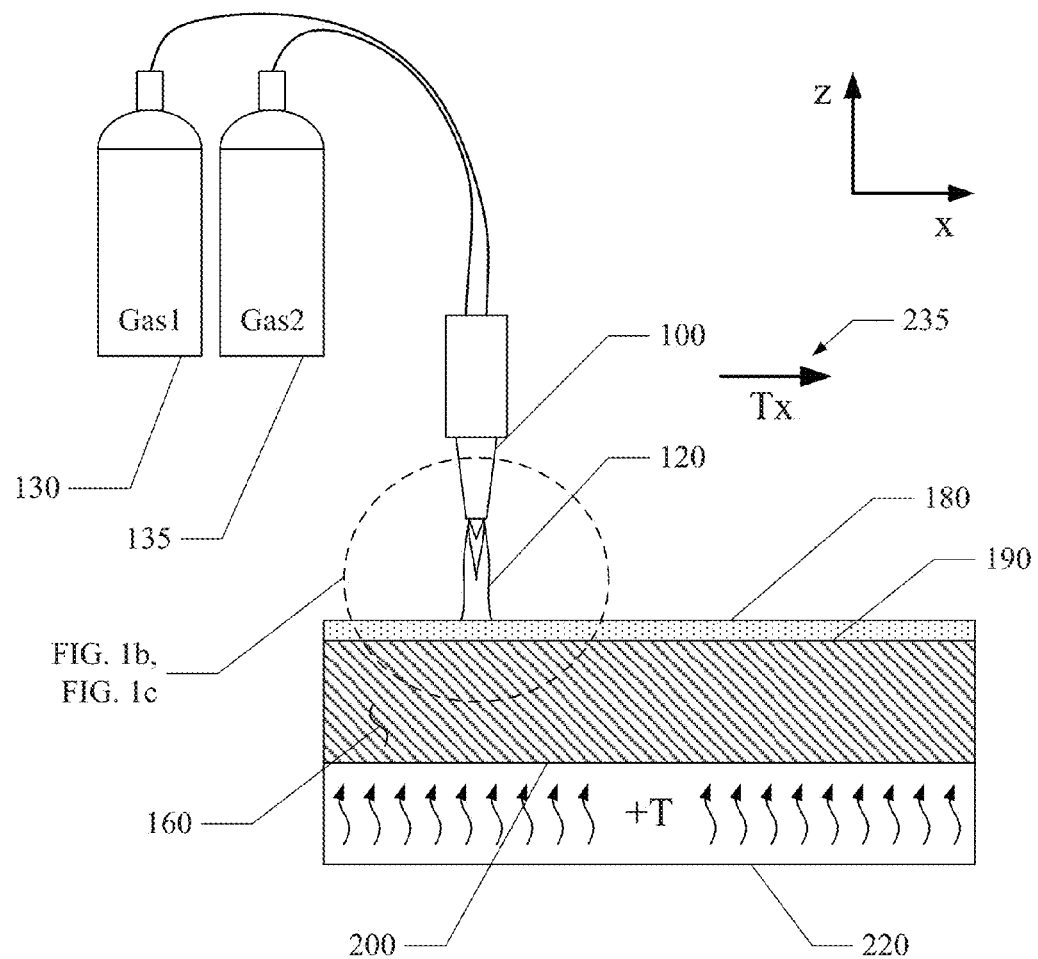
FIG. 1a is a schematic showing various features of the disclosed apparatus. The features shown in FIGS. 1a and 1b illustrate key elements of the inventive device.
Figure 1B:
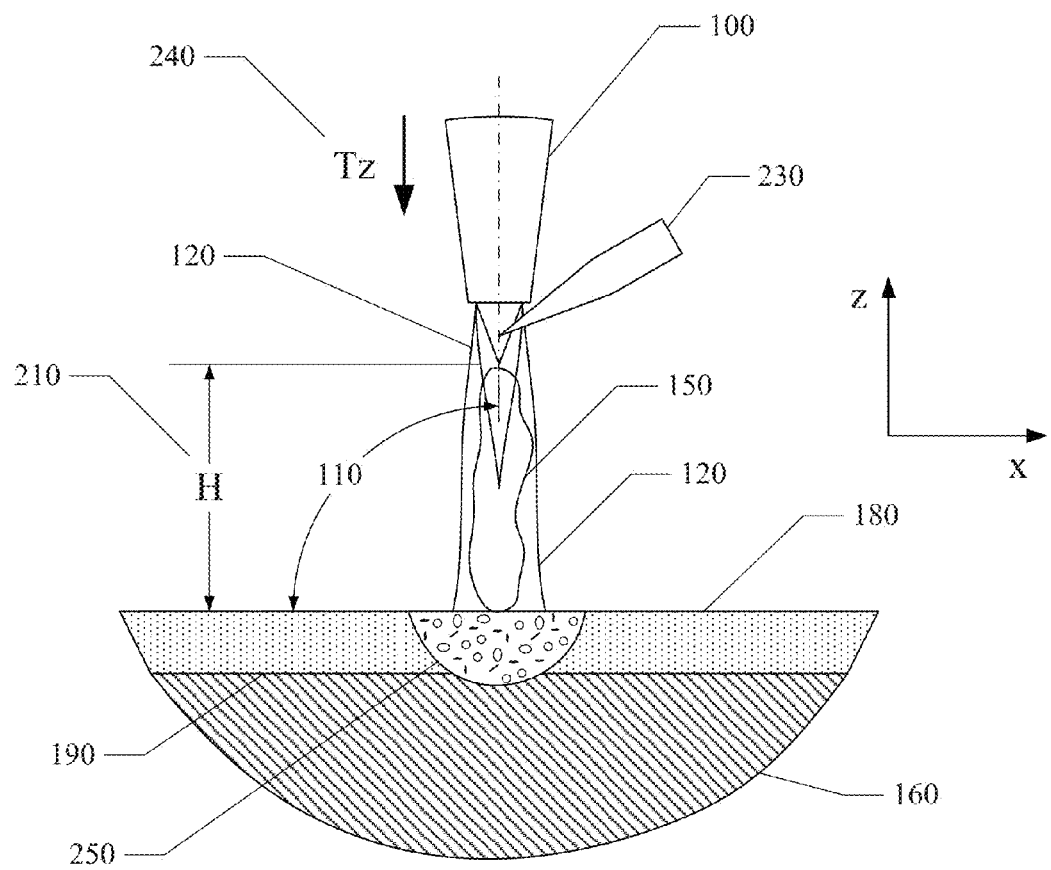
FIG. 1b shows a detailed view, taken from FIG. 1a, showing additional features of the disclosed apparatus at greater magnification. Also shown are additional features not shown in FIG. 1a for clarity.

The features shown in FIGS. 1a and 1b illustrate key elements of the inventive device. FIG. 1b is a detailed view, taken from FIG. 1a, showing features at greater magnification. Also shown are additional features not shown in FIG. 1a for clarity.

A flame means, such as, for example, a commercial jeweler's torch, torch 100, is supplied a fuel mixture by pressure means capable of producing a flame 120. The fuel mixture may include argon, nitrogen, hydrogen, propane, methane, butane, acetylene, oxygen, air, and the like. Fuel, oxidizer, or other gas may be provided in tanks such as Gas 1 130 or Gas 2 135, wherein the fuel, oxidizer or other gas is stored in a compressed state, at substantially greater than atmospheric pressure. An oxidizer capable of sustained burning can entrain air. Normally, delivery of fuel is enabled passively by a valve and regulator system (not shown), creating a pressure difference between tanks such as Gas 1 130 or Gas 2 135 and the atmosphere. Alternatively, delivery of fuel may be provided by a gas pump (not shown) capable of pressurizing gas on demand. The flame 120, when sufficient conditions, such as voltage 140 are applied, is capable of conducting current through the flame that usually will take the form of a plasma 150. The type of fuel and the fuel mixture can be optimized for the type of powder to be sintered and other factors, such as the metal or other suitable substrate 160 to be coated, the plasma 150 required, and desired temperature profile 170. The plasma 150, in combination with the flame shown 120, will produce a spot-sized temperature profile 170, capable of forming a bonded area 250 of powder 180 to a first surface 190 of substrate 160 in seconds in an open atmosphere. Many shapes and forms of flame are possible, and a wide range of burners are applicable to this technique, to enhance the powder processing and area coverage.

Optionally, the substrate 160 may be preheated. Preheating may be performed in a wide range of known ways, including in an oven (not shown), then removed prior to sintering. Preheating may be performed by positioning a second surface 200 of substrate 160 in contact with, or near, a hotplate 220. Hotplate 220 may be any shape, from a traditional flat "plate" to a contoured shape configured to approximate the shape of a second surface 200 of substrate 160. The hotplate 220 enables heat within predefined limits to increase the temperature of the powder 180 and the first surface 190 of substrate 160, as needed, to improve the sintering process conditions. Preheating may also be performed locally with a torch 100, flame or other means, such as IR lamps.

Torch 100 is attached to a traversing means, simply shown as an arrow, indicating a velocity vector, velocity Tx 235. The traversing means, such as velocity Tx 235, is capable of travelling a predefined path or is capable of responding to an automatic control system (not shown). An automatic control system is capable of detecting a reference, such as an edge or edges, a protrusion, feature, or fiducial, then traversing a path relative to the reference, such as parallel, orthogonal, at an angle, or other linear or non-linear path. The traversing means may travel at a constant or variable rate specified by a user, or determined by a control system. The control system may, for example, automatically sense a surface temperature then iteratively adjust the rate to maintain the surface temperature within predetermined limits. The path may be limited to a single plane, commonly described as two-dimensional ("2D"), a single plane with up-down capability, commonly described as two-and-a-half dimensional ("2½ D"), or any space within two orthogonal planes, commonly described as three-dimensional ("3D"). Robotics systems can also be used to move the torch, the substrate, or both, as needed, to more effectively process various shapes and sized parts.

The substrate is positioned to receive the flame 120 and plasma 150, preferably at an angle 110 of roughly 90° to the flame to achieve the most centered flame and plasma profile. There may be occasions, however, when an angle substantially greater than or less than 90° is preferred. For example, while traversing a complex 3D shape, an angle 110 of 90° may cause physical interference that can be corrected by changing the angle 110 of the flame to the substrate. Instead, an angle 110 of, say, 105° or 75° may be preferred, but resulting in an uncentering of plasma and flame or a loss of energy to the surface. A control system can compensate for this energy loss by changing the rate of traverse or the distance from the surface as well. Similarly, traversing a corner, such as shown in FIGS. 3d and 3e, at a constant rate may increase the energy at the surface relative to the energy provided on a straight path. A control system may be used to automatically sense a surface temperature then adjust the rate to maintain surface conditions within predetermined limits.

The torch 100 may traverse in a 3D space, such as any combination of the common x, y, and z coordinates. The torch 100 may traverse in a z-direction towards the substrate 160, thereby decreasing distance H 210. This provides a means of warm-up at the first point of sintering. The traverse of torch 100 is shown by velocity Tz 240.

Figure 1C:
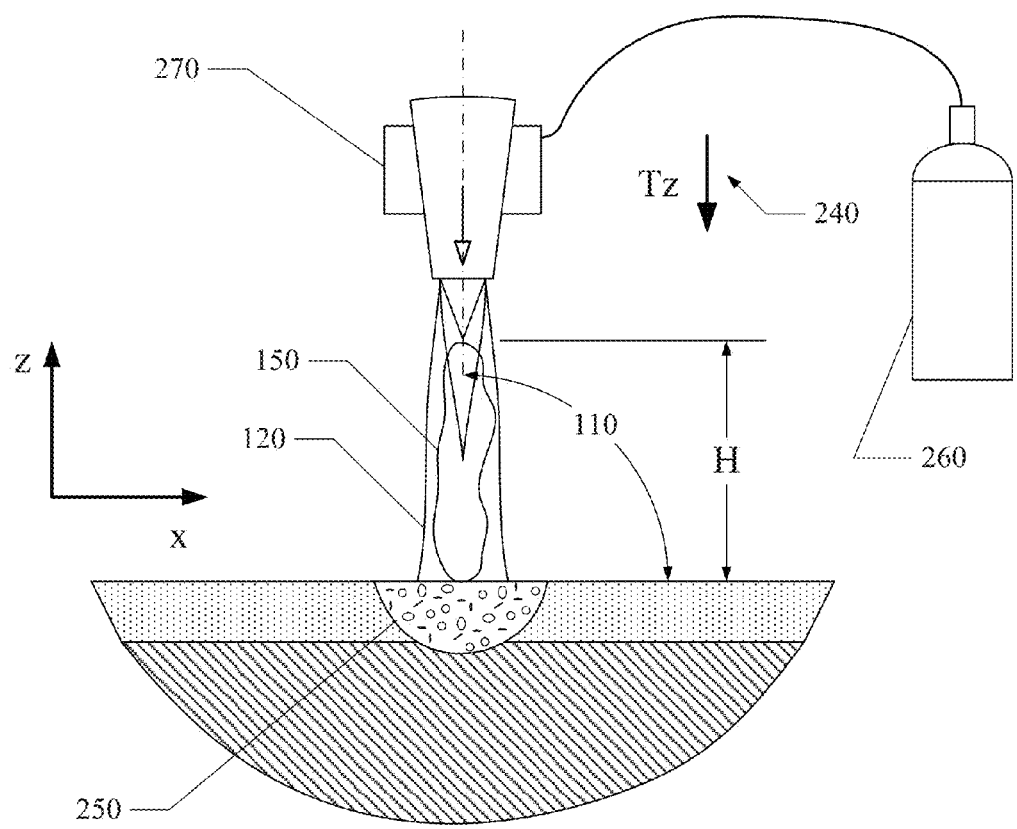
FIG. 1c shows a detailed view, taken from FIG. 1a, showing alternate features of the disclosed apparatus.

FIGS. 1b and 1c show the flame 120 positioned a distance H 210 from a first surface 190 of the substrate 160. It is known that the first surface 190 of substrate 160 will experience a flame 120 having increased temperature closer to the torch 100, such as when the distance H 210 is small. Likewise, it is known that that the first surface 190 of substrate 160 will experience decreased temperature as the distance H 210 increases.

FIG. 1c is a detailed view taken from FIG. 1a, showing features in greater magnification. Also shown is the electric plasma 150, an optional means of introducing dopant 260 to the plasma 150, dopant dispenser 270, and consolidation zone 250, wherein sintering of powder 180 to powder 180 and powder 180 to substrate 160 occurs. These features are not shown in FIG. 1a for clarity.

Introduction of a dopant 260 is used to increase plasma electrical conductivity due to an increase in ionic activity. One form of dopant is a chemical dissolved in a precursor solution or as a vapor in a gas stream, as described in U.S. Pat. No. 6,193,911, hereby incorporated herein by reference. In FIG. 1c, dopant dispenser 270 dispenses in-line with the flame 120. An alternate means of dispensing could dispense outside the flame 120, but directed towards the flame 120. Argon or another gas that will readily support a plasma, could be used to dope the gaseous fuel mixture but would not precipitate or condense in the coating. Most metal or metalloid elements when used as a dopant, however, could be deposited into the coating.

As described previously, dopants may be added to the flame 120 to affect the plasma temperature. It is preferred that dopants do not introduce contaminants into the powder 180 layer; thus, an element that results in a similar or complimentary constituent is preferred. By way of example, for a yttria-stabilized zirconia (YSZ) ceramic powder, a dopant containing yttrium nitrate, upon heating, will produce a byproduct of yttrium oxide, $Y_2O_3$.

Figure 1D:
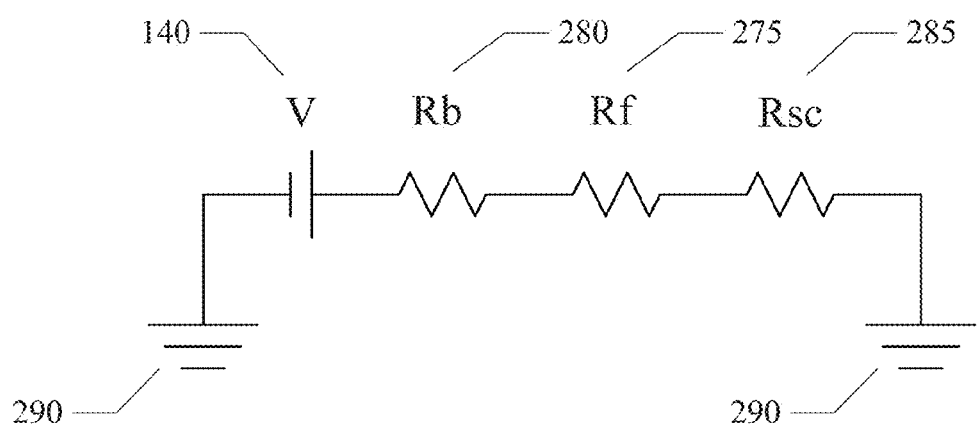
FIG. 1d shows a representative electrical circuit capable of creating conditions suitable for sintering. A circuit is made by electrically connecting a voltage V 140 to the torch and substrate. A ballast resistor Rb 280 is connected anywhere in the series circuit. Between the torch and the substrate electrode, there is an inherent electrical resistance in the flame, Rf 275, as well as the substrate and coating, Rsc 285. Ground 290 is relative and simply denotes the common voltage used to create the voltage used in the circuit.

FIG. 1d shows a representative circuit for creating conditions suitable for sintering. A circuit is made by electrically connecting a voltage V 140 to the torch and substrate. A ballast resistor Rb 280 is connected anywhere in the series circuit. Between the torch and the substrate electrode, there is an inherent electrical resistance in the flame, Rf 275, as well as the substrate and coating, Rsc 285. Ground 290 is relative and simply denotes the common voltage used to create the voltage used in the circuit.

At sufficient flame temperatures, a high density of ionized particles are present in the flame 120, resulting in a normal flame plasma. With an electrical bias applied, such as voltage V 140, these charged particles will move, creating a current. At sufficient levels of ionization, caused by high temperatures and sufficient electrical current, there is dielectric breakdown when the plasma 150 discharge occurs, the flame resistance Rf 275 can drop by over 90%. Without the flame present, such an electrically generated discharge plasma is not possible at such low voltages or currents. It is such an electrical plasma in a flame that is important in the method of the present invention. A passive ballast in series, such as a ballast resistor 280, can be used to prevent current spikes. Alternatively, a ballast capacitor may be preferred in some applications or a ballast coil when alternating current is used. An active circuit can be used for Rb, such as an appropriately designed power supply, providing similar ballast function during plasma discharge, may also be used to regulate the circuit resistance during discharge.

FIG. 1b shows an alternative means of connecting voltage V 140. Instead of connecting voltage V 140 to the torch 100, an independent flame electrical input 230 may be used. This provides an alternate means of creating an electrical bias to enable an electrical plasma 150 in the flame 120. A material that is both electrically conductive and able to withstand high temperatures, such as tungsten, tungsten alloy, or platinum, is introduced into the flame 120, as shown in FIG. 1c. The combined energy of the flame 120 and plasma 150 result in a high energy consolidation zone 250, wherein bonding of powder 180 to powder 180 and powder 180 to substrate 160 occurs.

The substrate 160 may be a metal, semiconductor, ceramic, composite, metal-coated insulator, or other substrate having high temperature consolidation requirements but should have higher electrical conductivity than the coating. The powder 180 may be a metal or ceramic or mixture also having high temperature consolidation requirements. The surface of the substrate may be pre-treated by physical or chemical means to improve adhesion with the powder in its green and/or sintered states. Physical means include sand-blasting, mechanical abrasion, polishing, and the like. Chemical means include bond-coating, chemical etching, and the like. One preferred embodiment includes a substrate 160 of stainless steel and a powder 180 of ceramic. The powder 180, typically having a desired distribution of particle sizes, is applied to the substrate. Because the powder is not yet sintered, it is described as "green" or powder in a "green state." The powder may be provided with a binder as a preformed shape, provided in a flexible tape form, or compacted directly onto the substrate. The powder in green state may also contain sintering aids to provide improved sintering of the powder.

Additional variables can be controlled instead of, or in addition to, a traversing rate to maintain proper surface conditions suitable for creating an effective consolidation zone 250 that traverses the powder and forms a continuous sintered coating. For example, energy from flame 120 can be controlled by the amount, mixture, or type of gas supplied to the flame, such as Gas 1 130 and Gas 2 135. Energy from the plasma 150 can be controlled by controlling the current or input voltage V 140, type of gas or gas mixture or by the introduction of a dopant 260 to the flame, as described previously.

Figure 2:
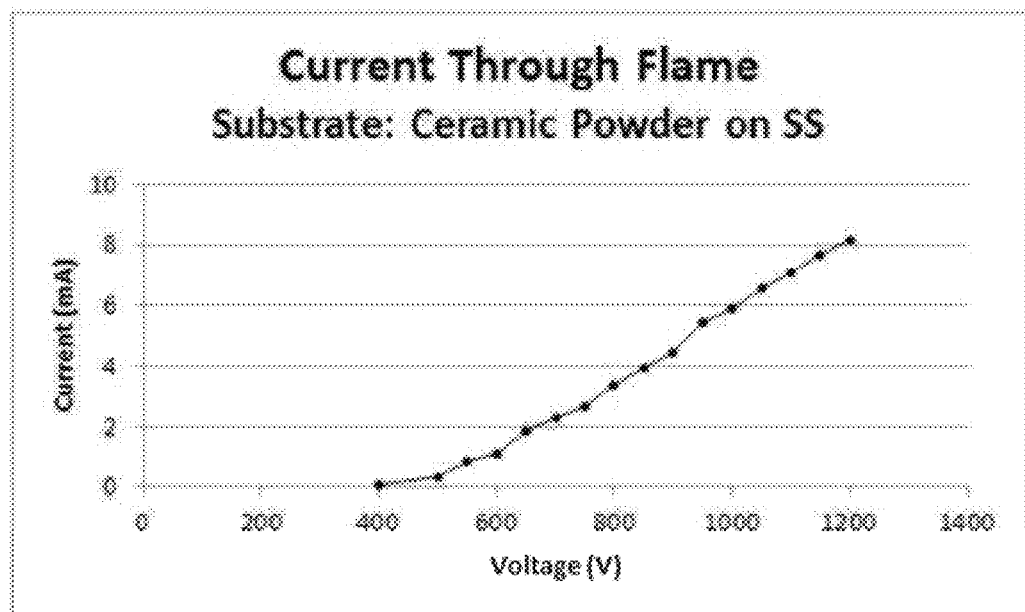
FIG. 2 shows a chart describing current as a function of voltage through a flame. Specifically.

FIG. 2 shows a chart describing current as a function of voltage V 140 through a flame 120. The fuel mixture used for FIG. 2 includes propane for Gas 1 130, and oxygen for Gas 2 135. Substrate 160 is stainless steel, coated with a 20-25 micron-thick powder layer 180 of 8YSZ ceramic. Under these conditions, 400 V produced a measurable current of 0.07 mA and a dramatic brightening in the flame, indicating electrical plasma formation in the flame. A nearly linear increase in current occurred with an increase in voltage. Testing extended up to 1200 V, resulting in a current of over 8 mA, created through the flame.

Figures 3A, 3B, 3C:
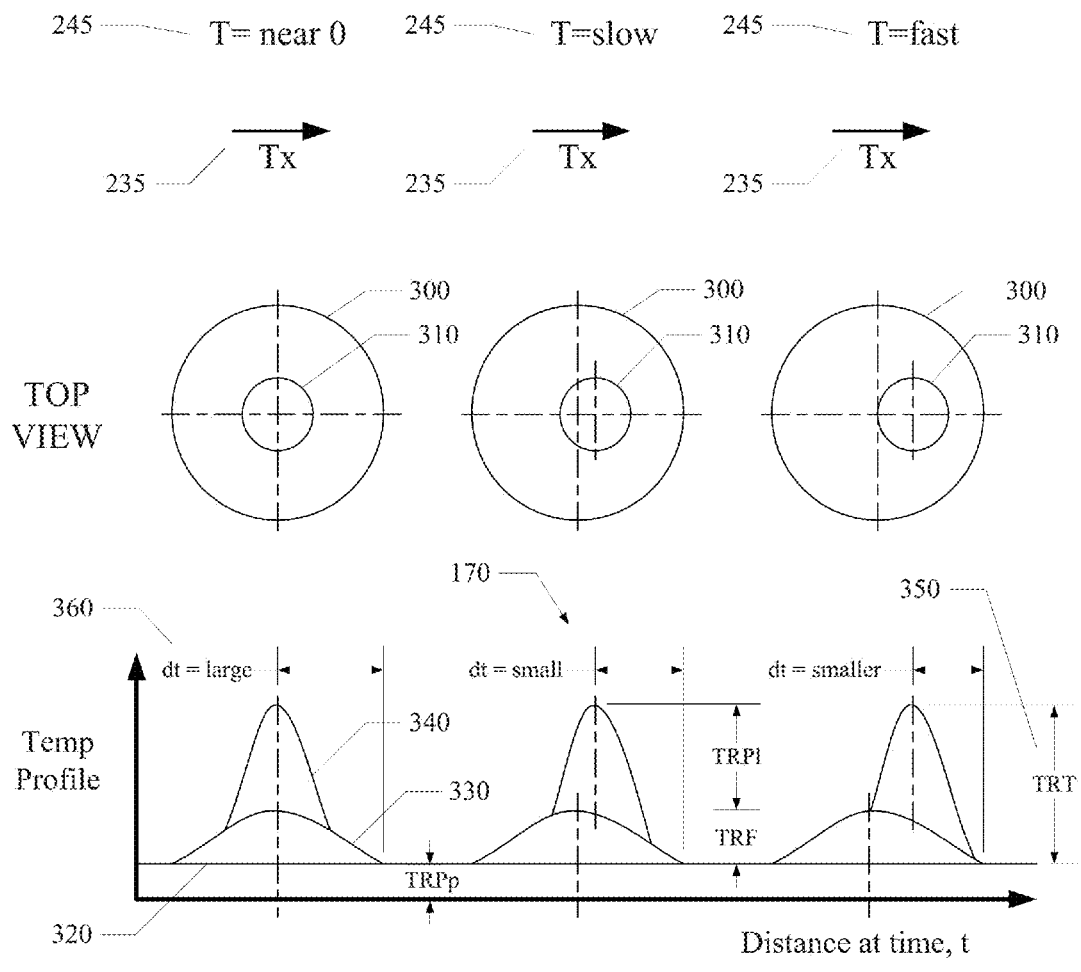
FIGS. 3a-c describe the relationship of a combined flame and plasma heat source in combination with travel speed for a spot size on a substrate. Each figure shows a top view including a flame energy spot 300 and a plasma energy spot 310, with a plasma energy spot 310 having a smaller diameter than the flame energy spot 300. Each figure shows the relationship of the plasma energy spot 310 relative to the flame energy spot 300 based on traverse speed S 245 of the torch 100 with a vector Tx 235. Just below, a relative temperature/energy profile of the substrate at a given position in time is illustrated, each of which corresponds to the top view.
Figure 3D:
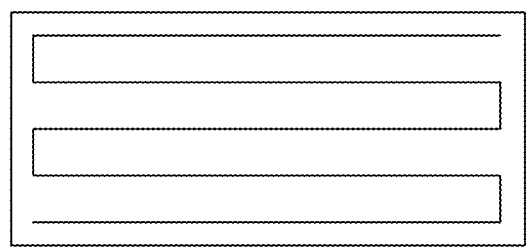
FIGS. 3d and 3e show different paths that a torch 100 may traverse to consolidate an area of green powder 180 onto substrate 160. A rectangular pattern, as shown in FIG. 3d, may result in an ideal traverse path, having no overlaps. In contrast.
Figure 3E:
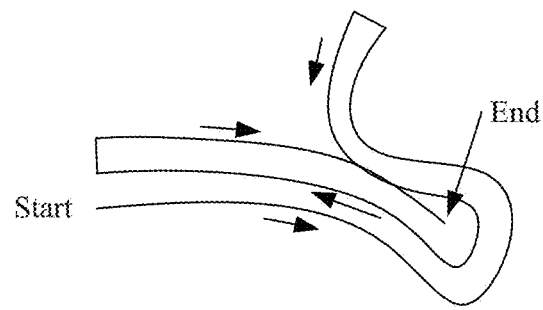

FIGS. 3a-c describe the relationship of a combined flame 120 and plasma 150 heat/energy effects in combination with travel speed for a spot size on a substrate as measured at the substrate at a given point in time. Each figure shows a top view including a flame energy spot 300 and a plasma energy spot 310, with a plasma energy spot 310 having a smaller diameter than the flame energy spot 300. Each figure shows the relationship of the plasma energy spot 310 relative to the flame energy spot 300 based on traverse speed S 245 of the torch 100 with a vector Tx 235. Just below, a relative temperature/energy profile of the substrate at a given position in time is illustrated, each of which corresponds to the top view.

In FIG. 3a, the traverse speed S 245 is "near zero," resulting in the plasma energy spot 310 generally centered within the flame energy spot 300 in concentric circles. To simplify the following discussion temperature is taken to mean energy available to perform the desired sintering and can be in various forms such as electrical current, plasma, thermal, or chemical sources. The corresponding total temperature rise TRT 360 includes a preheat temperature rise TRPp 345 from a preheat temperature profile 320, a flame temperature rise TRF 350 from a flame temperature profile 330, and a plasma temperature rise TRP1 355 from a plasma temperature profile 340. In these examples, a preheat temperature profile 320 exists. If not, the total temperature rise TRT 360 would likely be increased, because the consolidation temperature required for effective consolidation would remain unchanged. As the flame traverses, at least the first surface 190 of substrate 160 will experience a flame temperature rise TRF 350 from the flame energy spot 300, then a plasma temperature rise TRP1 355 from the plasma energy spot 310 after a period of time. The rate of temperature rise would be the temperature rise divided by time dt 370. For example, a rate of total temperature rise would be (total temperature rise TRT 360/time dt 370).

FIG. 3b shows a similar illustration to FIG. 3a for a "slow" traverse speed S 245 (but greater than near zero), wherein the plasma energy spot 310 is shown offset from the flame energy spot 300 in a direction of travel of velocity Tx 235. In this case, the rate of total temperature rise TRT 360 would be greater than in FIG. 3a due to a decrease in the denominator, time dt 370, for essentially the same numerator. Thus, at least the first surface 190 of substrate 160 will experience a more rapid temperature rise than in FIG. 3a.

FIG. 3c shows a case having a "fast" traverse speed S 245 (greater than "slow"), wherein the plasma temperature rise TRP1 355 is experienced even more quickly due to a further decrease in time dt 370. A rate of total temperature rise that occurs too quickly may cause shock to the powder 180, substrate 190, or both. However, a rate of total temperature rise TRT 360 that is too slow may cause increased ceramic grain growth or oxidation of at least the first surface 190 of substrate 160. Grain growth may be preferred in some applications, but oxidation of the substrate is generally avoided during surface bonding.

FIGS. 3d and 3e show different paths that a torch 100 may traverse to consolidate an area of green powder 180 onto substrate 160. A rectangular pattern, as shown in FIG. 3d, may result in an ideal traverse path, having no overlaps. In contrast, FIG. 3e shows an irregular pattern having an area of overlap. At least a first surface 190 of substrate 160 would experience a total temperature rise TTR 360 more than once in specific areas. Due to thermal cycling and differences in thermal expansion possibly causing cracking or spalling, it might be best to minimize any overlaps. Additionally, the flame 120 is not a binary device that may be switched off then on again at will. An inventive solution includes switching off the plasma 150 but not the flame 120, reducing the total temperature rise TRT 360 of the surface to within acceptable limits for many applications. If a further reduction of energy is needed the flame 120 may be raised, resulting in an increased distance H 210, thereby further reducing the temperature of at least the first surface 190 of substrate 160 that had previously been sintered. These methods may also be used to preheat a region prior to sintering.

Although flame-assisted flash sintering is capable of being used in a vacuum environment, with flames being stable to at least 15 torr, it is practically preferred for use in non-vacuum environments, enabling in-place applications, such as very large components, repair applications, and applications requiring challenging orientations, such as vertical or overhead surface coatings.

Additionally, although FAFS was developed for coating metals, it is applicable to any substrate having electrically conductive properties, and other desired properties.

Flame-assisted flash sintering may also be used for bonding or welding of material(s) to conductive surfaces. In this case, the material could be in a green, partially sintered, or fully sintered state. During bonding of the material, the material may also undergo partial or full sintering or grain growth. The material to be welded may be in the form of a green-state coating, as a tape or sheet, or a solid, shaped to conform to the substrate surface.

It is also possible to sinter just desired areas with the FAFS process. If the material is in coating form, specific areas of the coating may be welded and sintered to the substrate by FAFS, and the unwelded and unsintered ceramic could be removed to expose the substrate in areas where no coating is desired. Unsintered material can be removed by many different processes, including washing, scrubbing, blowing, vibration, or other known cleaning or removal methods. The FAFS process can be localized and it may be easier to define shapes and areas for the coating to remain than to mask or otherwise limit where the material is to be applied to the substrate.

For the examples described, the following preparations were made. A slurry was made for coating metal substrates. The slurry or paste can be made in many ways, or purchased. The following is simply the method used and does not limit the FAFS process.

Oxide powder is added to a solvent and dispersed with an ultrasonic probe (e.g., Hielscher UIP100hd). Slurries were sonicated for ~10 min at ~75% amplitude while manually stirred in an ice bath to minimize solvent evaporation. Slurries were cooled to room temperature via the ice bath prior to use. Once settling in the slurry begins to occur (typically ~30-60 min after sonication), slurries were resonicated and cooled to room temperature again before further use. The end fractional amounts are approximate because some solvent is lost.

Example Slurry Recipes:

| YSZ | |
|---|---|
| 44.3 g Tosoh TZ-8YS YSZ powder | 78 wt % powder of slurry |
| 56.7 g n-butanol solvent | 9.7 vol % powder of slurry |
| LSM | |
| 40.35 g n-butanol solvent | 55 wt % powder of slurry |
| 22.15 g nGimat-produced LSM powder | 6.4 vol % powder of slurry |
| MCO | |
| 22.15 g nGimat-produced MCO | 32 wt % powder of slurry |
| 48.28 g n-butanol solvent | 21 vol % powder of slurry |

The metal substrate was prepared as follows. After cutting to size and removal of masking adhesive, 0.075" grade-430 stainless steel substrates (McMaster Can #1292T26) were cleaned with distilled ethanol in an ultrasonic bath cleaner for ~15 min to remove any residual adhesive remaining on the substrate surface. After cleaning, substrates were rinsed in reverse osmosis or distilled water and sprayed dry with compressed air. Care was taken to keep dust particles and drying marks to a minimum.

The slurry was applied as a coating onto the metal substrate as follows. Clean substrates were placed onto flattened sheets of aluminum foil and then onto the glass coating plate of a bench top automated coating system. A size #70 wound-wire Meyer rod was cleaned by bath sonication in distilled ethanol and sprayed dry with compressed air. Cleaning cycles with ethanol were continued until the rod was completely clear of debris. With both substrate and coating rod cleaned, the rod was inserted into the holder and lowered onto the substrate. Slurry was pipetted onto the substrate and the coating rod was drawn across. After coating, wet samples were transferred to a hot plate and dried for ~5 min at ~130° C. Once dry, coated substrates were inspected manually for defects and any excess coating was removed from the substrate back with a dust-free wipe.

Typical coating thicknesses for LSM and MCO samples were ~12-15 μm, while YSZ samples typically had a dried thickness of ~25-30 μm. For the listed examples, the following equipment was used, but these items could be replaced with other equipment or set of components that perform similar functions:

1. The flame equipment used was a Smith Little Torch with #5 tip (jeweler's torch)
2. The voltage or current supplies used were a Stanford PS300 high voltage power supply, an Acopian P01HP60 high voltage power supply, and a Hoefer PS2500 high voltage power supply; they were used interchangeably.
3. Alicat mass flow controllers, 0.5 SLPM and 2.0 SLPM (propane and $O_2$, respectively)
4. Omega OMEGALUX® infrared radiant panel heater
5. Standard (industrial) grade propane and oxygen gases
6. Custom-made substrate chuck, made from type 309 stainless steel of dimensions 3"×6"×¼"

Using the above equipment and prepared materials, the examples listed below were made with the following process. Single-sided coated substrates were clamped into place in the substrate chuck. The clamping ensured there was good electrical contact between the sample and the chuck, which is connected to electrical ground through a 100 kΩ ballast resistor. The substrate chuck was positioned atop the substrate heater such that the chuck rested only on the ceramic surface of the heater and did not physically touch the metallic body of the heater. Electrical grounding issues may occur if the metallic chuck does touch the metallic heater body, which is in electrical contact with essentially all components of the FAFS system (enclosure, motor drives, etc.). The ballast resistor is connected in series with the negative side of the power supply and serves to restrict the maximum current in the circuit. The ballast resistor is intentionally placed on the negative side of the circuit so that the positive voltage applied to the torch is not attenuated through additional resistance before any plasma is ignited. Note that the ballast resistor must be of a sufficient wattage rating to handle the power delivered to it: in these experiments, a 25-W ballast resistor of 100-150 kΩ resistance was used. The resistor was found to help stabilize the power flow, but other means to finely control the electrical power, such as different circuitry or power supplies, can replace this or alter its value.

The substrate heater was driven by a PID temperature controller and set to a temperature between 300 and 800° C. A separate thermocouple device monitored the surface temperature of the substrate chuck (the PID temperature controller reads the temperature inside the heater box, not on the surface) and typically reads 100-200° C. lower than the heater set-point. Thus, the baseline temperature of the substrates was between 200 and 700° C. rather than 300-800° C. The entire heater assembly was mounted on a single-axis linear motion stage.

The torch is clamped by an electrically insulating fixture onto a two-axis linear motion stage above, in the vicinity of the substrate heater and coated substrate. It is important that the torch be clamped using electrically insulating materials to prevent high voltage from being transferred to the motion system and thus the rest of the assembly. This is important both for operator safety and practical purposes, to avoid shorting the power supply to ground. The high voltage is supplied to the torch by means of an electrical spade lug that is silver-soldered to the body of the electrically conductive torch tip. A matching spade connector crimped onto the end of a cable (capable of withstanding high voltages) mates to the lug; this cable is connected to the positive terminal of the power supply.

A motion trajectory for the torch is determined and programmed into software that controls the motion of the entire three-axis system. It is useful to define a three-axis Cartesian coordinate system consisting of x, y, and z axes, such that the z-axis is parallel to the common understanding of vertical (up and down) movement, and the x-y plane is orthogonal to the z-axis. The trajectory used in all experiments to date consisted of holding the torch at a fixed height (z position) above the substrate surface while rastering along at a fixed speed in the x-y plane. At the end of each raster line (assuming rastering along the major axis, x), the substrate position is indexed in y and the torch returns to the initial x position. This pattern is repeated a number of times until the desired number of scan lines have been executed. Practical values used in our example experiments are shown in the table below.

| | |
|---|---|
| z height | 0.10-0.15" |
| z trajectory speed | 10-12"/min |
| x trajectory speed | 1-10"/min |
| y trajectory speed | 1-10"/min |
| x scan length | 1-3" |
| y index position length | 0.05-0.1" |

Before electrically energizing the circuit, combustible gases are delivered to the torch and the flame is lit. Successful methods of gas delivery in these experiments included manual rotameter flow devices as well as electronic mass flow controllers designed to deliver precise amounts of gas. The latter has the advantage of creating a very stable flame, which is required to support a stable plasma. Fuel and oxidizing gases were delivered through separate mass flow controllers and premixed within the torch assembly. Propane and oxygen were used as the primary fuel gases in these experiments in amounts of 100 sccm and 375 sccm of flow, respectively. Other fuel gases that were tested included methane and acetylene, but it was determined that the former burned too cool and the latter burned too hot for the specific experimental conditions desired. Air, and argon mixed with oxygen, were demonstrated to be functional with the FAFS process but were not used in these examples. Various gases (or other fuel gases, such as butane and hydrogen) may be used once appropriate experimental conditions are ascertained.

By setting a voltage on the power supply, the FAFS circuit was energized. All experiments to date were performed as described above with the torch at a positive electrical potential with respect to the substrate chuck, and, by extension, the substrate. It may be that reversing the polarity of this voltage may show comparable or even greater success than the present configuration. Changing the placement of the ballast resistor to the positive side of the circuit is also a modification that may be contemplated with the experimental parameters. It is noted that the torch is only electrically energized after lighting the combustible gases for safety reasons. Voltages between 500 and 1100 V were applied to the torch (with respect to the substrate) to achieve currents ranging from 1 to 5 mA. The optimal configuration to date has been to run the power supply in constant voltage mode, meaning that the current responds to a fluctuating resistance while the voltage at the torch remains constant. An alternative method is to run the power supply in constant current mode, in which the voltage responds to fluctuations in resistance while the current remains constant. In theory, constant current mode should be preferable because the temperature increase due to the electrical current within the ceramic is proportional to power, and power is proportional to the square of the current multiplied by the ceramic resistance. As the ceramic resistance remains mostly constant, a change in current has a significant effect on the deposited power, and thus the temperature increase, within the ceramic. In practice, however, we found that a constant current mode was more difficult to implement than a constant current mode due to the finite response time of the power supply. However, this may simply be an equipment limitation because we do not have the ideal power supply.

Once a flame is lit and the torch is electrically energized, the scanning motion trajectory begins, with the torch descending in the z-axis until it reaches the fixed height at which it will begin the x-y scanning motion. A typical value for this height is 0.15", which provides enough space for stable combustion of the fuel-gas mixture before the primary combustion zone contacts the substrate surface. The z-height is an important parameter in the FAFS process, because the hottest section of the flame can reach temperatures in excess of 2,000° C., sufficient to oxidize, damage, or even melt the ceramic coating or metal substrate. For the flame device, use at a height of 0.1" may damage the coating due to extreme heat stress, while a height of 0.2" may be too far away from the surface to generate a stable plasma arc using the current torch apparatus.

The nature of the FAFS process differs substantially between the two ceramic materials most studied and successfully demonstrated thus far, 8YSZ and LSM. In the case of 8YSZ, an extremely bright plasma was ignited as the torch approached a height of 0.15". Using a voltage of 850 V, the current generated was 2.5-3.5 mA. The substrate heater was set to 800° C. for 8YSZ and lower temperatures tended to cause coating spalling or delamination. The plasma arc, which extended visibly from the torch tip to the substrate, moved rapidly and sporadically within the lateral extent of the combustion zone. For a x-y scanning speed of 1"/min, the 0.1-0.2 mm diameter plasma arc moved in such a way as to expose 50-80% of the ceramic coating within the lateral extent of the combustion zone.

LSM, on the other hand, displayed a dull-glowing plasma arc that existed primarily on the periphery of the combustion zone and did not move sporadically, but instead more readily stayed in one location, relative to the torch tip. The result was a straight sintered line, generated by the moving torch tip, as opposed to a network of irregularly shaped lines formed on the 8YSZ coatings. The experimental parameters used for the LSM experiments were a heater set-point of 350° C., power supply voltage of 1100 V, current of 3.0-4.0 mA, and x-y scanning speed of 10"/min. It was found that higher substrate heater temperatures were detrimental to the LSM coatings, unlike 8YSZ.

Once the scanning trajectory was complete, samples were either allowed to cool slowly to room temperature while residing on the substrate heater, or were instantly removed for examination. There was no noticeable difference observed between the two different cooling rates, although one may be preferable to the other upon closer examination in the future.

Example 1

TABLE 1

Experimental parameters for Example 1.

| Heater SP (° C.) | Voltage (V) | Current (mA) | Flame Tz (in/min) | Traverse speed | Flame + ceramic resistance (kΩ) |
|---|---|---|---|---|---|
| 700 | 750 | 2.5 | 3-12 | 1-10 | 100-200 |
| Electrical input power (W) | Nozzle height H (mm) | Propane flow (sccm) | $O_2$ flow (sccm) | Powder size (nm) | Plasma arc diameter (μm) |
| 1.6 | 2.25 | 100 | 370 | 200 | 70-100 |

Figure 4A:
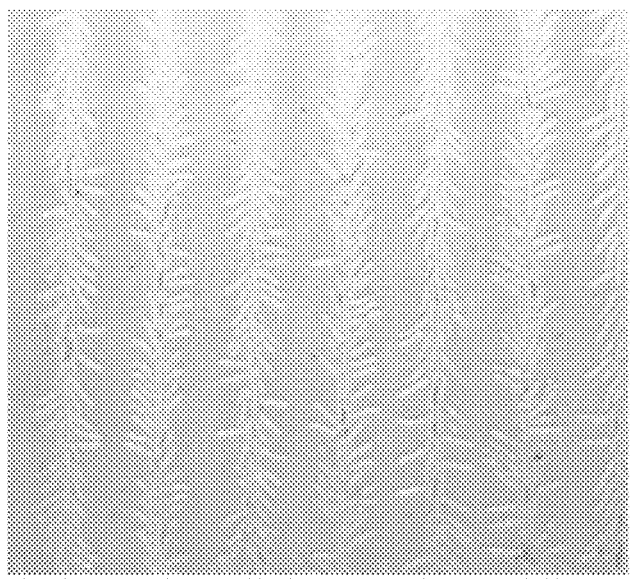
FIGS. 4a-c show images of actual test results according to one aspect of the present disclosure.

FIG. 4a is an image of actual test results from the experimental parameters and conditions shown in Table 1.

Figure 4B:
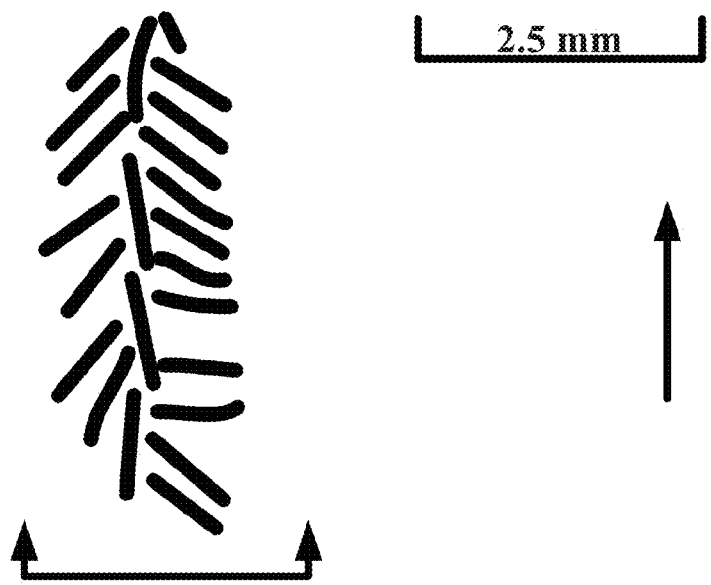

FIG. 4b is a line drawing reproduced from a section of FIG. 4a for clarity. Lines illustrate ceramic particles of 8% yttria-stabilized zirconia ("8YSZ") that were sintered as the plasma within the flame traversed a path over the surface. The flame path is indicated by the vertical arrow shown. Note the interrupted sintering pattern shown. Instead of a continuous vertical line, a series of discontinuous lines, angled (+/−) slightly off-vertical (flame direction) occur. These measure about 0.9 mm in length, and include a separation distance of roughly 0.2 mm. Additionally, random sintering lines extend out from each side of the vertical path at a greater angle, and are also separated by a distance of roughly 0.2 mm from the vertical sintered line segments. This pattern roughly simulates typical arrow fletching. Such patterns are more commonly formed at larger nozzle heights which requires higher voltage, perhaps resulting in a plasma energy that is too high, with multiple electrical plasma streams occurring with a somewhat repeatable, but irregular, fletching pattern.

Tests were performed over a range of traverse speeds and flame warm-up as the torch approached the substrate (Tz).

Figure 4C:
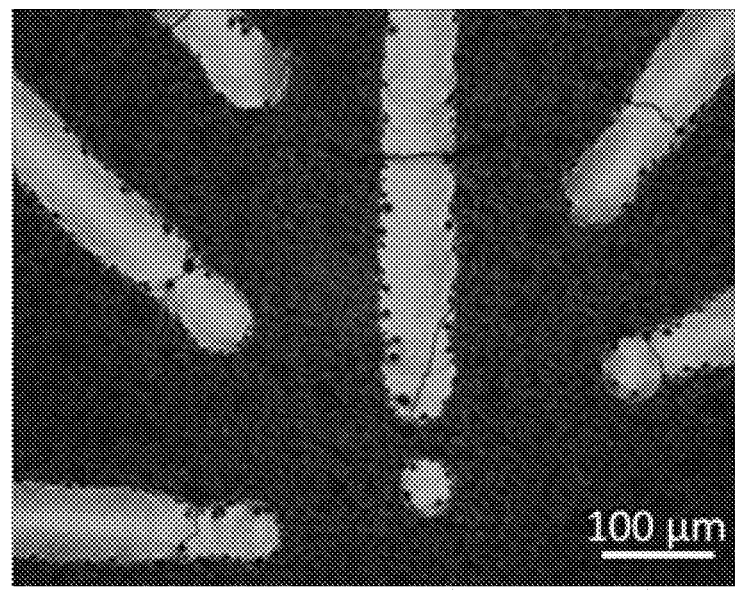

FIG. 4c shows a magnified view of FIG. 4a including the scale of the image. It is clear that sintering has formed grains at a width of at least 60 microns, which is hundreds of times greater than the original grain size. The change in contrast of the sintered feature shows the ceramic to be fully consolidated into a single surface with little to no visible porosity, suggesting a fully densified region.

Example 2

Compared with Example 1, voltage is set at three discrete levels, resulting in total electrical input powers of 1.0 W, 1.5 W, and 1.9 W. The ceramic material is 8YSZ. The nozzle height was reduced 0.5 mm, down to 1.75 mm.

TABLE 2

Experimental Parameters for Example 2

| Heater SP (° C.) | Voltage (V) | Current (mA) | Flame approach speed | Linear flame speed (in/min) | Flame + ceramic resistance (kΩ) |
|---|---|---|---|---|---|
| 700 | 650, 940, 1080 | 2, 3, 4 | 3-12 | 1-10 | 125-250 |
| Electrical input power | Nozzle height | Propane flow (sccm) | $O_2$ flow (sccm) | Ceramic Particle size | Plasma Arc diameter (μm) |
| 1.0, 1.5, 1.9 | 1.75 | 100 | 370 | 200 | 200-300 |

Figure 5A:
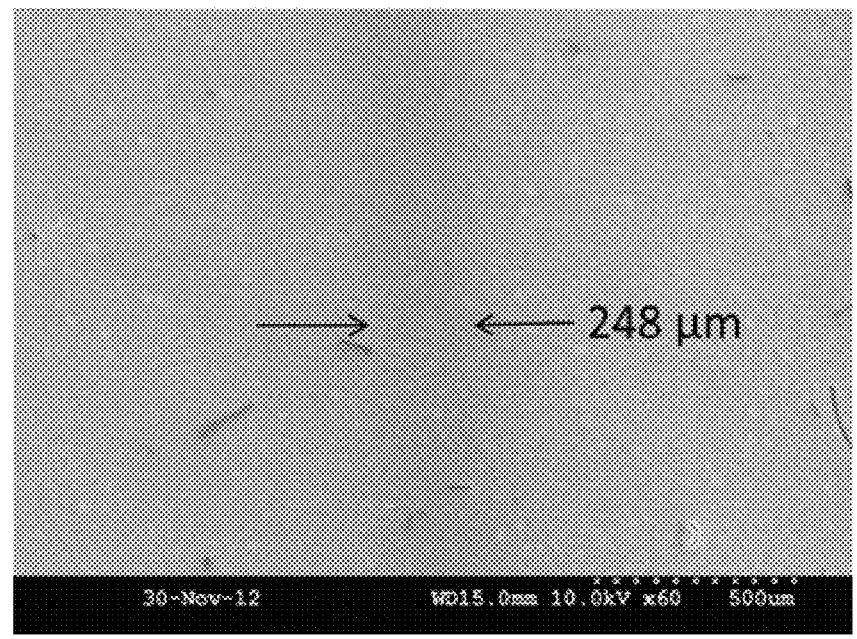
FIGS. 5a-b show scanning electron microscope images of sintered features at various test conditions.
Figure 5B:
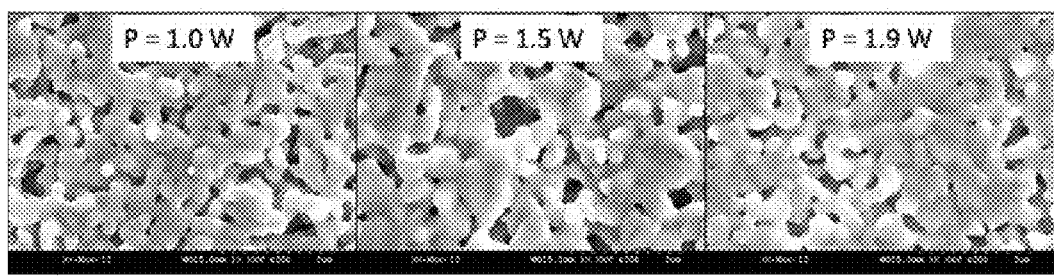

FIGS. 5a and 5b correspond to the Table 2 parameters. FIG. 5a illustrates a continuously sintered line roughly three times the width of the sintered features shown in Example 1, but the change in contrast is more subtle, with grain features still evident. FIG. 5b shows three scanning electron microscope (SEM) images, corresponding to the three power levels. Grain growth of the ceramic particles is clearly evident, but full consolidation, as shown in FIG. 4c, was not achieved. This level of sintering may be ideal for some applications, such as thermal insulation or abrasion resistance, but may not be adequate where a sealed surface is required, such as for corrosion resistance or fuel cell membrane.

FIG. 6 shows the parameters of Table 2 but includes multiple FAFS passes.

In these examples, the effects of particle consolidation are shown based on the number of times the FAFS process passes over the same region. FIGS. 6a and 6b show a level of consolidation of particles with one pass, although some porosity is visible. FIGS. 6c and 6d show an increase to three passes with a corresponding increase in particle consolidation due to increased grain growth. Yet a further increase in consolidation is shown in FIGS. 6e and 6f.

Example 3

TABLE 3

Experimental Parameters for Example 3.

| Heater SP (° C.) | Voltage (V) | Current (mA) | Flame Tz (in/min) | Traverse speed (in/min) | Powder size (nm) | Flame + ceramic resistance (kΩ) |
|---|---|---|---|---|---|---|
| 350 Electrical input power (W) | 1050 Nozzle height H (mm) | 4.0-4.5 Propane flow (sccm) | 10-12 $O_2$ flow (sccm) | 10 | | 100-200 Plasma Arc diameter |
| 3-5 | 3.71 | 100 | 370 | 40 | | 100-150 |

Example 3 demonstrates the applicability of the FAFS invention to densify a different ceramic material, lanthanum strontium manganite (LSM). FIGS. 8a-b show a photograph and scanning electron micrograph, respectively, of LSM ceramic particles that were densified using the described invention. In FIG. 8a, the FAFS device was rastered with small offsets in the regions that exhibited a lighter, more reflective surface. This color change is indicative of material densification, as shown in FIG. 8b, which is a higher magnification scanning-electron microscope image of the same surface shown in 8a. To yield crack-free LSM coatings it was determined experimentally that lower heater temperatures were needed than YSZ, which corresponds well with YSZ having a much higher melting point than LSM. The FAFS process was optimized to demonstrate a region of sintered surface LSM that was achieved by running the FAFS equipment in a defined pattern (FIG. 8). The plasma arc path on the LSM coatings was mostly continuous and well-defined straight line that moved with the flame path. LSM represents a different class of materials from 8YSZ in that it differs in crystal structure, melting point and exhibits much higher electrical conductivity.

Example 4

The preferred embodiment in Example 4 is suitable for YSZ or LSM on a 430 grade ferritic stainless steel substrate. The FAFS method and device is useable for a wide range of coating materials and substrates, with appropriate adjustments to achieve the desired coating density and sintering. LSM coatings used low temperature for the preheat and this will likely be appropriate for lower melting point materials. More insulating materials will likely behave more like YSZ, with the arc wandering more than was the case with the less resistive LSM. One skilled in art of materials processing will understand the properties of the coating composition, substrate properties, and limitations and choose appropriate conditions to achieve the desired end coating properties.

Experimental parameters for Example 4.

| Heater SP (° C.) | Voltage (V) | Current (mA) | Flame approach speed (in/min) | Linear flame speed (in/min) | Flame + ceramic resistance (kΩ) |
|---|---|---|---|---|---|
| 300-800 Power in flame + ceramic (W) | 300-1100 Nozzle height (mm) | 1.5-4.0 Propane flow (sccm) | 3-10 $O_2$ flow (sccm) | 2-10 Substrate thickness (mm) | 100-200 Plasma Arc diameter (μm) |
| 1.5-5 | 2.5-4.0 | 100 | 370 | 1-4 | 75-300 |

Bonding of the ceramic to the substrate was confirmed by scratch testing using a steel pick. FIGS. 7a and 7b each show SEMs of two samples stitched together in the same image. The top image shows an unsintered region (no arc plasma), while the bottom image shows a sintered region (with arc plasma). In FIG. 7a, a scratch is clearly shown in the unsintered region, but is essentially invisible in the sintered region, confirming a bond between the ceramic and the substrate. The scratch pressure was not measured, but was consistent. FIG. 7b is a magnified view of FIG. 7a. The scratch is clearly seen in the unsintered region and a mark is seen in the sintered region, but ceramic was not removed from the substrate. Energy-dispersive X-ray spectroscopy (EDX) was used to determine that this mark was a deposit of stainless steel from the scratch tool. Thus, the sintering and ceramic-to-substrate bond remained strong even with scratch pressure sufficient to abrade the stainless steel pick.

The results achieved differ widely from those achieved by flame or arc plasma alone. On both YSZ and LSM coatings, flame-only processing was performed and nominal sintering was achieved and the adhesion was poor. A TIG welder was tried with the YSZ coating and the arc would jump from spot to spot where, it is believed, there was a lower electrical resistance to the powder coating. The TIG-treated material could be readily removed from the surface and the plasma arc could be scanned continuously over the surface.

The FAFS process uses a flame to define a path where the plasma arc is restricted and then the flame can be traversed or moved relatively over the area to be treated. Additionally, the flame has some conductivity and can support a lower resistance path so that lower power plasma arc can exist versus non-flame-based plasma arcs. The plasma is a composite of both a flame plasma and an electric arc plasma, which enables a lower current flow than is required to sustain a pure electric arc so that the right amount of energy to properly sinter, without damaging the powder coating, can be achieved more readily. Less than one-quarter the 'normal' current of a 'pure' arc plasma is desirable. The current and voltage required to form an arc plasma is known to vary with the composition of the gas medium. Thus the one-quarter comparison is for a generally similar gas composition with simply a reduction of the fuel component so that a flame cannot be ignited. Of course, any air that might be entrained should be included in the gas mix. Furthermore, the flame helps to bring the coating material up to a temperature where electric current sintering can be effective.

The powder coating should be of good quality without coating material lacking in the area of processing. While the flame does control the zone of the electric plasma are, if there are holes or cracks in the coating, the arc will try to move to these areas of a lower resistance path and will jump over or move quickly by areas where the coating has significantly higher resistance.

Coating contaminants should be minimized, as is the case for most coating methods. Conductive contaminants, which approach size of the coating thickness, should also be eliminated as much as possible because these can also act as grounds for the arc to jump to. Some contaminants might dramatically alter the melting point or resistance of the coating and result in different coating morphologies or properties as well as difficult to control currents or voltages. As with many processes, cleaner or more consistent properties are better.

Embodiments of the present invention include:
1. A method of manufacturing a coated substrate, the method comprising:
   a. providing a substrate having an exposed first surface,
   b. providing a powder having of a plurality of articles,
   c. disposing said powder to said first surface of said substrate to form a powder layer
   d. providing a flammable gas capable of creating a flame,
   e. providing an orifice capable of dispensing said flammable gas toward said powder layer on said substrate,
   f. creating a flame that connects a first electrode to the flame so that a high voltage current can pass from the flame, through the powder layer and substrate to a second electrode connected to said substrate,
   g. electrically energizing said electrodes causing a current flow through said flame and powder layer,
   h. wherein said flame produces chemically and thermally generated ions as constituents of a flame plasma and the electrical potential creates an arc-like plasma in the flame wherein the arc-like plasma occurs at a voltage and current at least one-quarter of that possible without a flame, and
   i. consolidating said powder on said substrate in said current flow area,
2. A device for sintering a powder coating on to a substrate comprising:
   a. at least one fuel source capable of supplying a fuel
   b. a fuel delivery means, capable of delivering at least one fuel to a torch
   c. said torch capable of producing a flame of sufficient temperature to produce a plasma
   d. an electrical circuit configured to flow current through said plasma
   e. a controller or electrical circuit capable of controlling current
   f. a traversing means capable of traversing said torch while said plasma is energized with current.
3. A FAFS method of manufacturing a coated substrate, the method comprising:
   a. providing a substrate having an exposed first surface
   b. providing a powder having of a plurality of particles.
   c. disposing said powder to said first surface of said substrate to form a powder layer
   d. providing a flammable gas capable of creating a flame
   e. providing a flame head, burner or torch capable of dispensing said flammable gas toward said powder layer on said substrate
   f. creating a flame near or on a first electrode so that a high voltage current can pass from the flame, through the powder layer and substrate to a second electrode connected to said substrate.
   g. electrically energizing said electrodes causing a current flow through said flame and powder layer
   h. consolidating or sintering said powder on said substrate in said current flow area.
4. The method in 3. (above) wherein the substrate is a metal, a semiconductor, or composite containing a metal or a semiconductor.
5. The method in 3. (above) wherein the powder is a ceramic, metalloid, or semiconductor.
6. The method in 3. (above) wherein the powder has an electrical conductivity less than that of said substrate.
7. The method in 3. (above) where the powder has an electrical conductivity less than that of said substrate.
8. The method in 3. (above) where the flame head, burner or torch capable is electrically energized by means of an AC or DC power supply and creates electrical plasma in the flame.
9. The method in 3. (above) further comprising applying from 100 V to 1500 V of electrical potential between said electrode and a second electrode attached to said substrate and having at least 1 mA of current.
10. The method in 3. (above) wherein said current flow is between 1 mA and 100 mA.
11. The method in 3. (above) wherein said current flow is between 2 mA and 30 mA.
12. The method in 3. (above) further comprising applying from 200 V to 800 V of electrical potential between said electrode and a second electrode attached to said substrate and having at least 2 mA of current.
13. The method in 3. (above) where the said electrical potential is introduced into the flame by an electrode that is adjacent to or in the flame.
14. The method in 3. (above) wherein said flame is in the temperature range of 1000° C. to 3000° C. and produces chemically and thermally generated ions as constituents of a plasma.
15. The method in 3. (above) wherein said flame produces chemically and thermally generated ions as constituents of a flame plasma and the electrical potential creates an arc-like plasma in the flame.
16. The method in 15. (above) wherein the arc-like plasma occurs at a voltage and current at least less than one-quarter of that possible without a flame in similar gas composition with less fuel gas so is not ignitable.
17. The method in 3. (above) wherein the electric arc is traversed over select areas where coating material is desired for the product being made and subsequently the FAFS-treated powder layer is removed when the substrate is subject to a cleaning or unsintered powder removal method.
18. The method in 3. (above) wherein the FAFS process is repeated at least twice over the coating material.
19. A device for sintering a powder coating on to a substrate comprising:
   a. at least one fuel source capable of supplying a flammable gas fuel.
   b. a fuel delivery means such as a control valve, mass-flow controller or rotameter, capable of delivering at least one gaseous fuel to a torch
   c. said torch capable of producing a flame of sufficient temperature to produce chemically and thermally generated ions as constituents of a flame plasma d. an electrical circuit configured to apply 100 V to 2000 V of electrical potential and control a desired flow of current of 1 mA to 100 mA through said flame plasma and create an arc plasma.
e. a controller or electrical circuit capable of controlling said current or said voltage
f. a traversing means capable of traversing said torch relative to the substrate while said plasma is energized with current.

20. The device in 19. (above) further comprising a resistor of 20 k to 300 k Ohm in the electrical circuit.

21. The device in 19. (above) further comprising a resistor of 40 k to 150 k Ohm in the electrical circuit.

22. The device in 19. (above) wherein said traversing means is a robotic arm with multiple degrees of motion freedom so that the torch can be maintained near the same angle and distance to the substrate even when the substrate is a complex shape.

23. The device in 19. (above) further comprising a substrate heating system that brings the coating and substrate up to a desired initial temperature for processing.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

While the invention has been particularly shown and described with reference to a preferred embodiment, it will be understood by those skilled in the art that various changes in form and detail may be made therein without departing from the spirit and scope of the invention.

All documents, books, manuals, papers, patents, published patent applications, guides, abstracts, and other references cited herein are incorporated by reference in their entirety. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

The invention claimed is:

1. A method of manufacturing a coating, the method comprising:
a. providing a substrate having an exposed first surface,
b. providing a powder having a plurality of particles,
c. disposing said powder to said first surface of said substrate to form a particle layer,
d. creating a flame near or on a first electrode so that a high voltage current can pass from the flame, through the powder layer and substrate to a second electrode connected to said substrate,
e. electrically energizing said electrodes causing a current flow through said flame and particle layer, and
f. consolidating or sintering said particles to some degree on said substrate in said current flow area.

2. The method of claim 1 wherein the substrate is a metal, a semiconductor, or composite containing a metal or a semiconductor.

3. The method of claim 1 wherein the particles are a ceramic, metalloid, or semiconductor.

4. The method of claim 1 wherein the particles have an electrical conductivity less than that of said substrate.

5. The method of claim 1 wherein the flame assembly is electrically energized by means of an AC or DC power supply and creates electrical plasma in the flame.

6. The method of claim 1 further comprising applying from 300 V to 2000 V of electrical potential between said first electrode and a second electrode attached to said substrate and having at least 1 mA of current.

7. The method of claim 1 wherein said current flow is between 2 mA and 30 mA.

8. The method of claim 1 further comprising applying from 200 V to 1500V of electrical potential between said first electrode and a second electrode attached to said substrate and having at least 2 mA of current.

9. The method of claim 1 wherein said electrical potential is introduced into the flame by an electrode that is adjacent to or in the flame.

10. The method of claim 1 wherein said flame is in the temperature range of 1000° C. to 3000° C. and produces chemically and thermally generated ions as constituents of a plasma.

11. The method of claim 1 wherein said flame produces chemically and thermally generated ions as constituents of a flame plasma and the electrical potential creates an arc-like plasma in the flame.

12. The method of claim 1 wherein the current flow occurs at a voltage at least less than one-quarter of that possible without a flame in similar gas composition and distance but with less fuel gas so is not ignitable.

13. A device for sintering a powder coating on to a substrate comprising:
a. at least one fuel source capable of supplying a flammable gas fuel,
b. a fuel delivery means such as a control valve, mass-flow controller or rotameter, capable of delivering at least one gaseous fuel to a torch,
c. said torch capable of producing a flame of sufficient temperature to produce chemically and thermally generated ions as constituents of a flame plasma,
d. an electrical circuit configured to apply at least part of the range of 100 V to 2000 V of electrical potential or a flow of current at least part of the range of 1 mA to 100 mA through said flame plasma and create an arc plasma, and
e. a controller or electrical circuit capable of supplying said current or said voltage.

14. The device of claim 13 further comprising a resistor of 20 k to 300 k Ohm in the electrical circuit.

15. The device of claim 13 wherein said traversing means is a robotic arm with multiple degrees of motion freedom so that the torch can be maintained near the same angle and distance to the substrate even when the substrate is a complex shape.

16. The device of claim 13 further comprising a heating system that brings the coating and substrate up to a desired initial temperature for processing.

17. A process for sintering a coating onto a substrate with a combination of a flame and an electric current wherein at least 1 mA of current is passed through the flame and coating to yield a higher degree of sintering to the coating than if the flame alone was used.

18. The process of claim 17 wherein the coating has a resistivity higher than that of the material it is on.

19. The process of claim 17 wherein said current flow is between 5 mA and 100 mA.

20. The method of claim 19 wherein the particles have an electrical conductivity less than that of said substrate.

* * * * *